United States Patent
Kang et al.

(10) Patent No.: US 9,484,496 B2
(45) Date of Patent: Nov. 1, 2016

(54) LIGHT EMITTING DEVICE, METHOD OF MANUFACTURING THE SAME, LIGHT EMITTING DEVICE PACKAGE AND LIGHTING SYSTEM

(71) Applicant: LG INNOTEK CO., LTD., Seoul (KR)

(72) Inventors: Dae Sung Kang, Seoul (KR); Jung Min Won, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/336,756

(22) Filed: Jul. 21, 2014

(65) Prior Publication Data

US 2014/0353580 A1    Dec. 4, 2014

Related U.S. Application Data

(63) Continuation of application No. 12/899,926, filed on Oct. 7, 2010, now abandoned.

(30) Foreign Application Priority Data

Feb. 4, 2010  (KR) .................. 10-2010-0010204

(51) Int. Cl.
| | |
|---|---|
| H01L 33/20 | (2010.01) |
| H01L 33/00 | (2010.01) |
| H01L 33/06 | (2010.01) |
| H01L 33/32 | (2010.01) |
| H01L 33/46 | (2010.01) |

(Continued)

(52) U.S. Cl.
CPC ............. *H01L 33/20* (2013.01); *H01L 33/007* (2013.01); *H01L 33/06* (2013.01); *H01L 33/32* (2013.01); *H01L 33/46* (2013.01); *H01L 33/12* (2013.01); *H01L 33/22* (2013.01); *H01L 2224/48091* (2013.01)

(58) Field of Classification Search
CPC .............................. H01L 33/20; H01L 33/22
See application file for complete search history.

(56) References Cited

U.S. PATENT DOCUMENTS

| | | | |
|---|---|---|---|
| 6,030,849 A | 2/2000 | Hasegawa et al. | |
| 6,274,890 B1 * | 8/2001 | Oshio et al. | 257/98 |
| 7,834,374 B2 | 11/2010 | Jang et al. | |

(Continued)

FOREIGN PATENT DOCUMENTS

| | | |
|---|---|---|
| CN | 1434984 A | 8/2003 |
| CN | 1498427 A | 5/2004 |

(Continued)

OTHER PUBLICATIONS

U.S. Appl. No. 12/899,926, filed Oct. 7, 2010, Kang et al.

(Continued)

*Primary Examiner* — Yu Chen
(74) *Attorney, Agent, or Firm* — Ked & Associates LLP

(57) ABSTRACT

A light emitting device includes an active layer formed between first and second semiconductor layers. The first semiconductor layer includes a first surface facing the active layer, a second surface opposing the first surface, and a side surface that includes a stepped portion. The stepped portion causes the side surface to extend beyond one of the first surface or second surface of the first semiconductor layer. A light emitting device may also be formed with a buffer layer that includes a stepped portion, and a light emitting device package and system may be formed from the light emitting devices.

19 Claims, 11 Drawing Sheets

(51) Int. Cl.
  *H01L 33/12* (2010.01)
  *H01L 33/22* (2010.01)

(56) References Cited

U.S. PATENT DOCUMENTS

| | | |
|---|---|---|
| 2002/0074556 A1 | 6/2002 | Kwak et al. |
| 2002/0149024 A1 | 10/2002 | Kato et al. |
| 2003/0062529 A1 | 4/2003 | Kato et al. |
| 2003/0173575 A1 | 9/2003 | Eisert et al. |
| 2004/0113166 A1 | 6/2004 | Tadatomo et al. |
| 2004/0217362 A1* | 11/2004 | Slater et al. ............... 257/79 |
| 2004/0238837 A1 | 12/2004 | Jacob et al. |
| 2005/0017258 A1* | 1/2005 | Fehrer et al. ............... 257/98 |
| 2005/0042787 A1 | 2/2005 | Ito et al. |
| 2005/0082546 A1 | 4/2005 | Lee et al. |
| 2005/0104081 A1 | 5/2005 | Kim et al. |
| 2005/0179130 A1 | 8/2005 | Tanaka et al. |
| 2006/0138937 A1* | 6/2006 | Ibbetson ............... F21K 9/00 313/502 |
| 2006/0225644 A1 | 10/2006 | Lee et al. |
| 2007/0176193 A1 | 8/2007 | Nagai |
| 2007/0295951 A1 | 12/2007 | Chyi et al. |
| 2008/0042149 A1 | 2/2008 | Yoon et al. |
| 2008/0111139 A1 | 5/2008 | Chae et al. |
| 2008/0296588 A1 | 12/2008 | Tsai et al. |
| 2009/0029499 A1 | 1/2009 | Nakahara |
| 2009/0085055 A1 | 4/2009 | Peng et al. |
| 2009/0140281 A1 | 6/2009 | Lee |
| 2009/0173965 A1 | 7/2009 | Shim et al. |
| 2009/0294784 A1 | 12/2009 | Nakahara et al. |
| 2010/0062554 A1* | 3/2010 | Kim ............... 438/29 |
| 2010/0123148 A1* | 5/2010 | Park ............... 257/94 |
| 2010/0140636 A1* | 6/2010 | Donofrio et al. ............... 257/98 |
| 2011/0012155 A1 | 1/2011 | Huang et al. |
| 2011/0062479 A1 | 3/2011 | Sugano et al. |
| 2011/0095327 A1 | 4/2011 | Shinohara et al. |

FOREIGN PATENT DOCUMENTS

| | | |
|---|---|---|
| CN | 1964081 A | 5/2007 |
| JP | 2002-232003 | 8/2002 |
| KR | 10/2004/0067397 | 7/2004 |
| KR | 10/2005/0013042 A | 2/2005 |
| KR | 10/2005/0013048 A | 2/2005 |
| KR | 2005-0038207 | 4/2005 |
| KR | 2009-0002161 A | 1/2009 |
| KR | 2009-0073946 A | 7/2009 |
| KR | 10/2009/0105462 | 10/2009 |
| TW | 427039 B | 3/2001 |
| TW | 200518364 | 6/2005 |
| TW | 200802965 A | 1/2008 |
| TW | 200802968 A | 1/2008 |
| TW | 200908378 A | 2/2009 |
| TW | 200915631 A | 4/2009 |
| WO | WO 2009/139376 A1 | 11/2009 |
| WO | WO 2009/154215 A1 | 12/2009 |

OTHER PUBLICATIONS

European Search Report dated Apr. 2, 2014 issued in Application No. 10 17 5066.
European Office Action issued in Application No. 10175066.9 dated Jul. 15, 2015.
European Office Action issued in Application No. 10175066.9 dated Feb. 19, 2016.

* cited by examiner

LIGHT EMITTING DEVICE, METHOD OF MANUFACTURING THE SAME, LIGHT EMITTING DEVICE PACKAGE AND LIGHTING SYSTEM

CROSS-REFERENCE TO RELATED APPLICATIONS

This application is a Continuation application of prior U.S. patent application Ser. No. 12/899,926, filed Oct. 7, 2010, which claims priority under 35 U.S.C. §119 of Korean Patent Application No. 10-2010-0010204 filed on Feb. 4, 2010, which is hereby incorporated by reference in its entirety.

BACKGROUND

1. Field

One or more embodiments disclosed herein relate to the emission of light.

2. Background

A light emitting diode (LED) is a semiconductor device that converts an electrical signal into light. These devices typically have a stack structure which includes a semiconductor layer of a first conductivity type, an active layer, and a semiconductor layer of a second conductivity type. Because of their size, LEDs have proven desirable for many applications. However, improvements are still needed.

DETAILED DESCRIPTION

Figure 2:
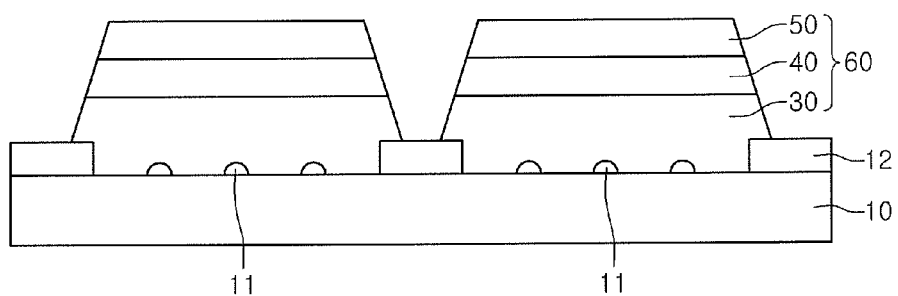
Figure 3:
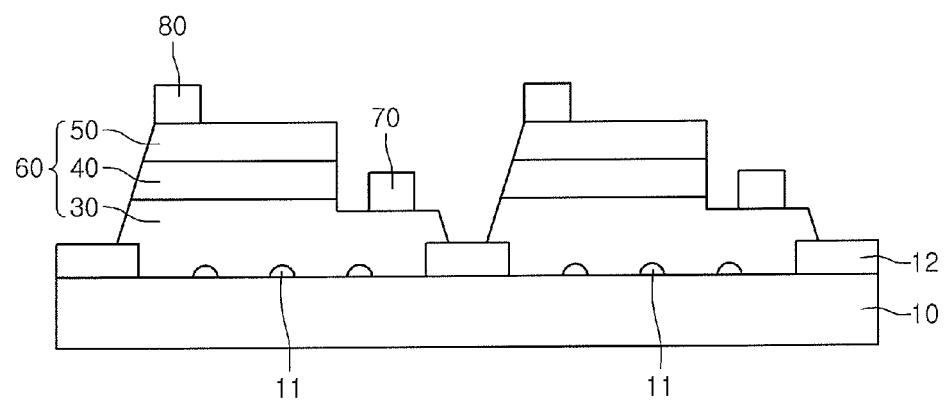
Figure 4:
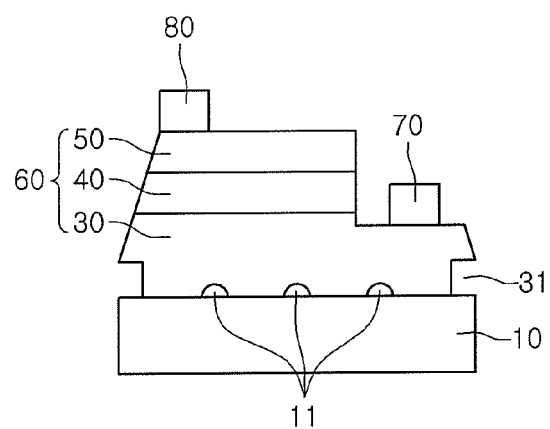

FIGS. 1 to 4 show one embodiment of a light emitting device and various stages of its manufacture. Referring first to FIG. 4, the light emitting device includes a light emitting structure layer 60 formed from a semiconductor layer 30 of a first conductivity type, an active layer 40 and a semiconductor layer 50 of a second conductivity type, all of which are supported by a growth substrate 10. The LED further includes a first electrode 70 formed on the first conductivity type semiconductor layer 30, and a second electrode 80 formed on the second conductivity type semiconductor layer 50.

A plurality of protrusions 11 are formed on the growth substrate 10. The protrusions 11 may be in a semi-spherical shape or another shape, and in terms of materials may be formed, for example, from one or more of $SiO_2$, SiN, GaO, ZnO, or ITO. The protrusions 11 may serve to enhance the light extraction efficiency of the light emitting device by allowing light emitted from the active layer 40 to be scattered. The protrusions 11 may provided in various numbers and/or shapes in addition to those shown in FIG. 4.

As indicated, the semiconductor layers on the growth substrate 10 include a first semiconductor layer, a second semiconductor layer, and the active layer between the first semiconductor layer and the second semiconductor layer. In the current embodiment, the first semiconductor layer is implemented by the first conductivity type semiconductor layer 30 and the second semiconductor layer is implemented by the second conductivity type semiconductor layer 50.

The first conductivity type semiconductor layer 30 is formed with a stepped portion 31 at a lower edge surface thereof. The stepped portion 31 may be formed by extending the lower edge surfaces of the first conductivity type semiconductor layer 30. Some portions of the first conductivity type semiconductor layer 30 are spaced apart from the growth substrate 10. Also, in one embodiment, at least a portion of the stepped portion 31 and the protrusions 11 may be disposed on the same plane.

The first conductivity type semiconductor layer 30 includes a first surface contacting the active layer 40 and a second surface oppositely facing the first surface. The area of the second surface may be smaller than a maximum area of the first conductivity type semiconductor layer due to the stepped portion 31.

One embodiment of a method for manufacturing the light emitting device shown in FIG. 4 will now be discussed with reference to FIGS. 1 to 4.

Figure 1:
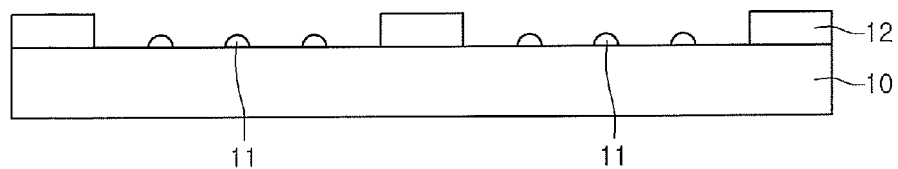
FIGS. 1 to 4 are sectional diagrams showing a first embodiment of a light emitting device and a various stages of its manufacture.

Referring to FIG. 1, a growth substrate 10 is prepared and a plurality of protrusions 11 and a mask layer 12 are formed on the growth substrate 10. The growth substrate 10 may be formed, for example, of one or more of sapphire ($Al_2O_3$), SiC, Si, GaAs, ZnO, MgO, GaN, Glass or $Ga_2O_3$. The mask layer 12 may be formed of the same material as that of the protrusions 11, e.g., $SiO_2$, SiN, GaO, ZnO, or ITO.

Figure 16:
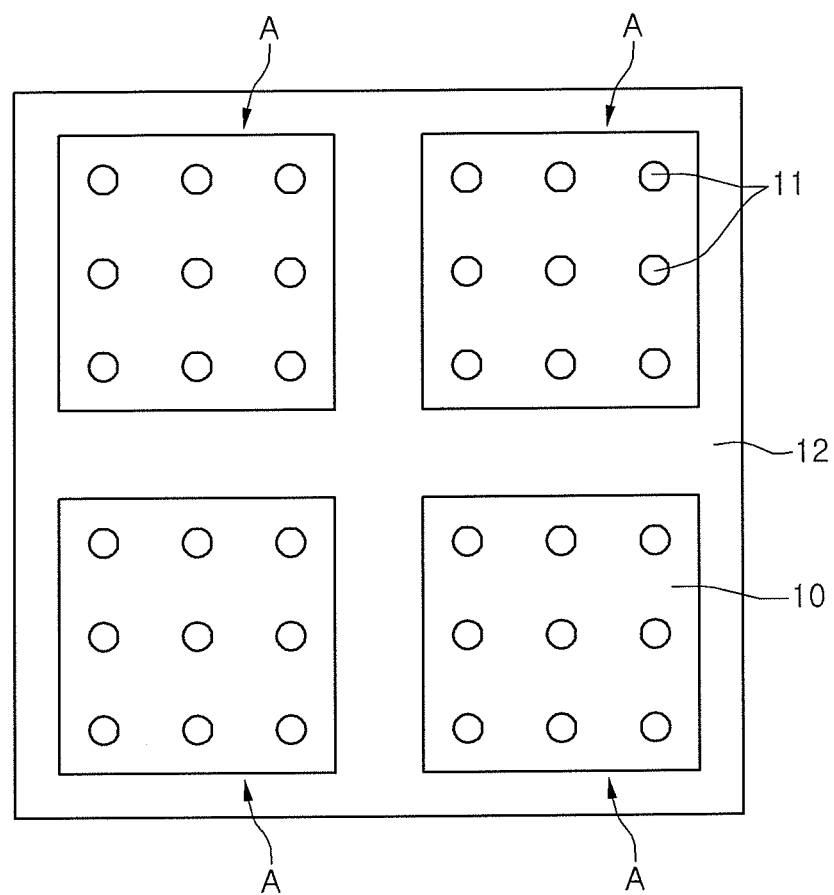
FIG. 16 is a diagram showing a mask layer and protrusions.

FIG. 16 shows an example of a plane view of mask layer 12 and protrusions 11. As shown in FIG. 16, the mask layer 12 may be formed so that the growth substrate 10 is exposed so that the light emitting structure layer 60 may be grown. That is, a plurality of light emitting structure layer growth regions A may be defined by the mask layer 12. The light emitting structure layer 60 may not be grown on the mask layer 12, and in such a case the light emitting structure layer 60 on the light emitting structure layer growth regions A may be grown so that they are separated from each other by the mask layer 12. The protrusions may be partially formed on the light emitting structure layer growth regions A of the growth substrate 10 where the mask layer 12 is not formed.

Figure 17:
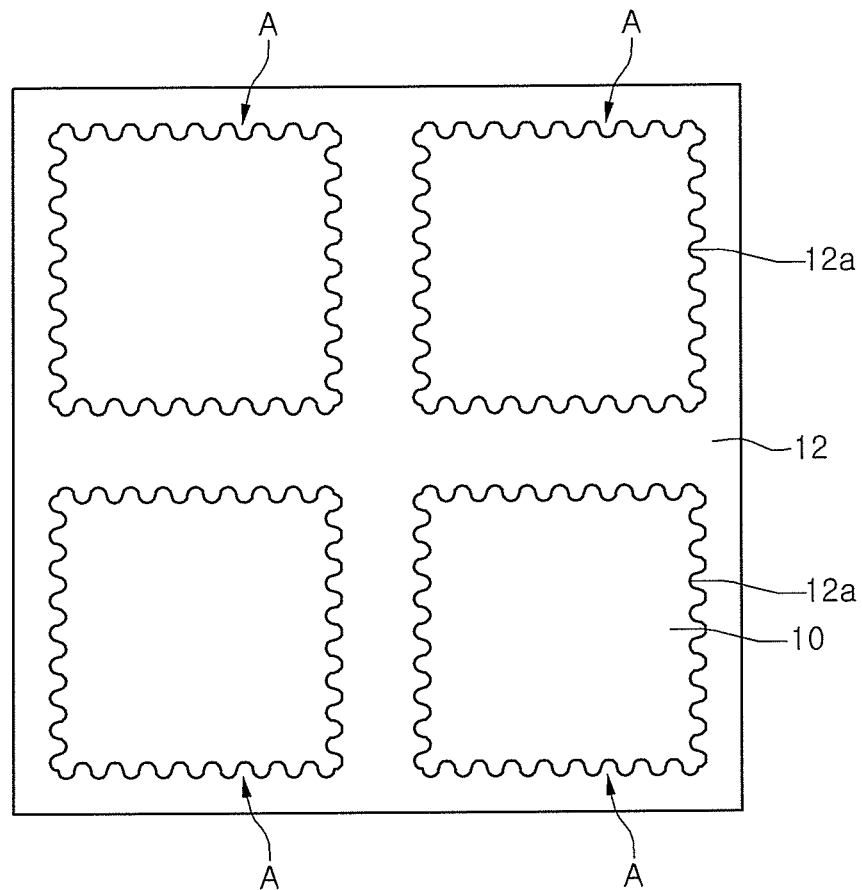
FIG. 17 is a diagram showing the same or another mask layer.

FIG. 17 shows another view of mask layer 12. As shown, the mask layer 12 formed on the growth substrate 10 and the light emitting structure layer growth regions A are defined by mask layer 12. Also, the protrusions 11 are not formed on the growth substrate 10, but a protrusion pattern 12*a* may be formed on a side surface of the mask layer 12. This or another protrusion pattern corresponding to protrusion pattern 12*a* may be formed on a side surface of the first conductivity type semiconductor layer 30 grown on the light emitting structure layer growth regions A.

Referring to FIG. 2, a light emitting structure layer 60, including the first conductivity type semiconductor layer 30, an active layer 40 and a second conductivity type semiconductor layer 50, is grown on the growth substrate 10 on which the mask layer 12 and the protrusions 11 are formed.

The first conductivity type semiconductor layer 30 is grown on the growth substrate 10 to cover the protrusions 11 through a horizontal growth and a vertical growth and to partially cover the mask layer 12.

The mask layer 12 allows the light emitting structure layer 60 to be grown in multiple chip units on a substrate, for example, by dividing the growth substrate 10 into a plurality of light emitting structure layer growth regions A on which the light emitting structure 60 is grown. Thus, instead of scribing the substrate into individual chip units first (that is, right after formation of the light emitting structure layer), the light emitting structure layer is grown into multiple chip units on a single substrate.

More specifically, when the aforementioned scribing technique is used, the crystallinity of a cleavage surface may not be good. As a result, leakage current may flow into the cleavage surface. However, when the light emitting structure layer is grown onto the substrate as separated or divided chip units, the resulting light emitting structure layer 60 is grown into a high quality thin layer having improved properties in terms of crystallinity of the side surface.

The first conductivity type semiconductor layer 30 may be grown, for example, as or into a GaN-based semiconductor layer including an n-type impurity such as silicon (Si), and the second conductivity type semiconductor layer 50 may be grown as or into a GaN-based semiconductor layer including a p-type impurity such as Mg.

The active layer 40 may be formed of InGaN layer/GaN layer having a single quantum well structure or multi-quantum well structure by supplying ammonia (NH3), trimethylgallium (TMGa), and trimethylindium (TMIn).

Referring to FIG. 3, a mesa etching step for partially removing the second conductivity type semiconductor layer 50, the active layer 40 and the first conductivity type semiconductor layer 30 is performed. By mesa etching, some of the first conductivity type semiconductor layer 30 is exposed in an upward direction. Thereafter, a first electrode 70 is formed on the first conductivity type semiconductor layer 30, and a second electrode 80 is formed on the second conductivity type semiconductor layer 50.

Referring to FIG. 4, the growth substrate 10 and the mask layer 12 are cut to divide the growth substrate 10 and the light emitting structure layer 60 into chip units. The growth substrate 10 may be cut by a scribing method or breaking method, and the mask layer 12 may be removed by an etching method.

At this time, the mask layer 12 may be partially or completely removed. In the case where the mask layer 12 is removed completely as shown in FIG. 4, the stepped portion 31 is formed at a lower edge region of the first conductivity type semiconductor layer 30.

In the case where mask layer 12 is formed as shown in FIG. 17, a protrusion pattern may be formed on a side surface of the first conductivity type semiconductor layer.

Figure 5:
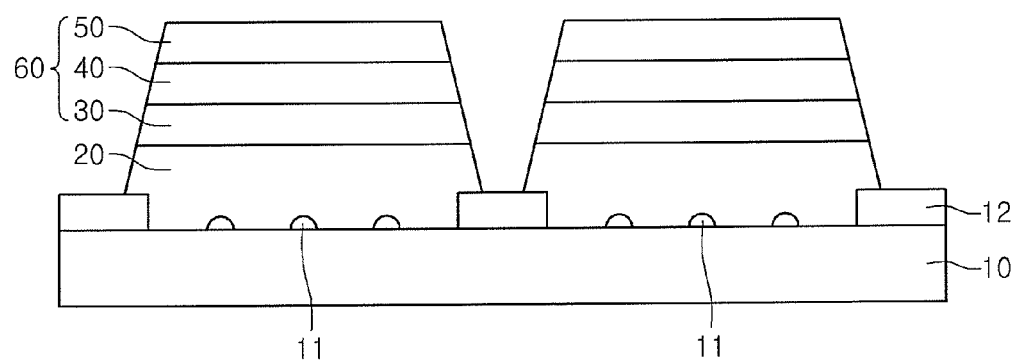
FIGS. 5 to 7 are sectional diagrams showing a second embodiment of a light emitting device and various stages of its manufacture.
Figure 6:
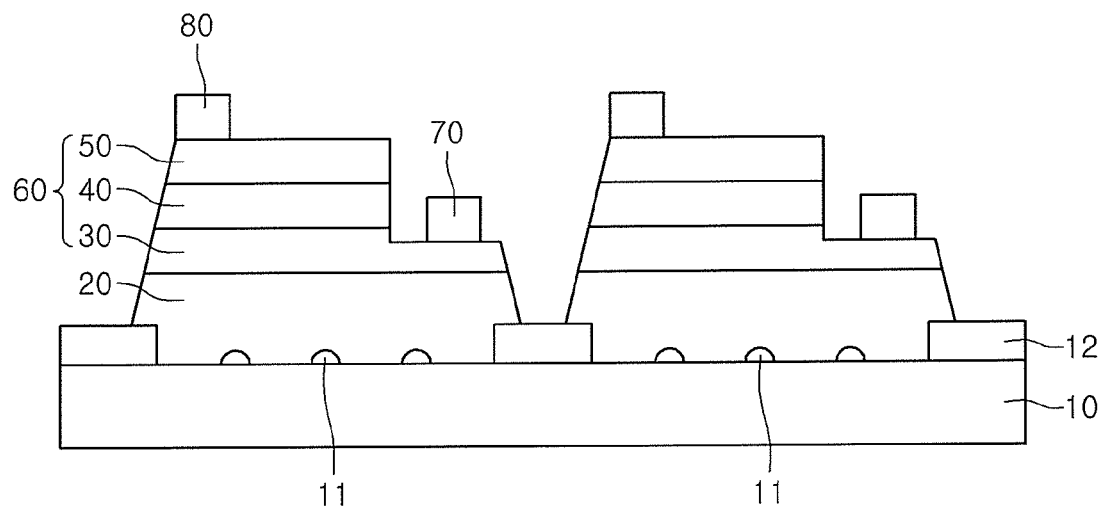
Figure 7:
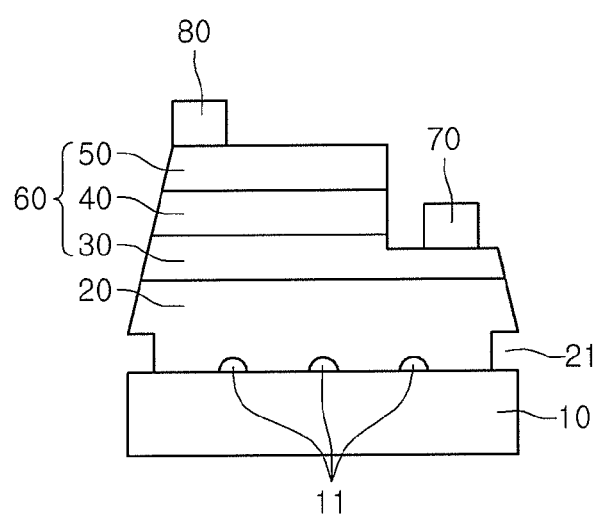

FIGS. 5 to 7 show a second embodiment of a light emitting device and various stages of its manufacture. Referring first to FIG. 7, the second embodiment of the light emitting device includes an undoped nitride layer 20 is formed on a growth substrate 10 and a light emitting structure layer 60 formed on the undoped nitride layer. The light emitting structure layer includes a first conductivity type semiconductor layer 30, an active layer 40, and a second conductivity type semiconductor layer 50. In addition, the LED includes a first electrode 70 formed on the first conductivity type semiconductor layer 30, and a second electrode 80 formed on the second conductivity type semiconductor layer 50.

A plurality of protrusions 11 are formed on the growth substrate 10. The protrusions 11 may be in a semi-spherical shape or another shape, and may be formed, for example, of one or more of SiO2, SiN, GaO, ZnO, or ITO. The protrusions 11 may serve to enhance the light extraction efficiency of the light emitting device by allowing light emitted from the active layer 40 to be scattered. The protrusions 11 may be provided in various numbers and/or shapes in addition to those shown.

As indicated, the semiconductor layers on the growth substrate 10 include a first semiconductor layer, a second semiconductor layer, and the active layer between the first semiconductor layer and the second semiconductor layer. In the current embodiment, the first semiconductor layer includes the undoped nitride layer 20 and the first conductivity type semiconductor layer 30, and the second semiconductor layer is includes the second conductivity type semiconductor layer 50.

The undoped nitride layer 20 is formed with a stepped portion 21 at one or more lower edge surfaces thereof. Some portions of the undoped nitride layer 20 may be spaced apart from the growth substrate 10. Also, at least a portion of the stepped portion 21 and the protrusions 11 may be disposed on the same plane.

The undoped nitride layer 20 may include a first surface contacting the first conductivity type semiconductor layer 30 and a second surface oppositely facing the first surface, and the area of the second surface may be smaller than a maximum area of the first conductivity type semiconductor layer due to the stepped portion 21.

One method for manufacturing the second embodiment of the light emitting device will now be described with reference to FIGS. 5 to 7. Referring to FIG. 5, a growth substrate 10 is prepared and a plurality of protrusions 11 and a mask layer 12 are formed on the growth substrate 10. The growth substrate 10 may be formed, for example, from one or more of sapphire (Al2O3), SiC, Si, GaAs, ZnO, MgO, GaN, Glass or Ga2O3. The mask layer 12 may be formed of the same material as the protrusions 11 and may be, for example, formed from one or more of SiO2, SiN, GaO, ZnO, or ITO.

An undoped nitride layer 20 is grown on the growth substrate 10 on which the mask layer 12 and the protrusions 11 are formed. A light emitting structure layer 60 including a first conductivity type semiconductor layer 30, an active layer 40 and a second conductivity type semiconductor layer 50 is grown on the undoped nitride layer 20.

The undoped nitride layer 20 is grown on the growth substrate 10 to cover the mask layer 12 and the protrusions 11 through a horizontal growth and a vertical growth. Although the undoped nitride layer 20 may not intentionally doped with a first conductivity type impurity, the undoped nitride layer 20 is a nitride layer which may have the first conductivity type conductivity, and may be, for example, formed of Un-GaN layer.

The first conductivity type semiconductor layer 30 may be formed, for example, of a GaN-based semiconductor layer including an n-type impurity such as silicon (Si), and the second conductivity type semiconductor layer 50 may be formed of a GaN-based semiconductor layer including a p-type impurity such as Mg.

The active layer 40 may be formed of InGaN layer/GaN layer having a single quantum well structure or multi-quantum well structure by supplying ammonia (NH3), trimethylgallium (TMGa), and trimethylindium (TMIn).

Referring to FIG. 6, the result of a mesa etching technique is shown for partially removing the second conductivity type semiconductor layer 50, the active layer 40, and the first conductivity type semiconductor layer 30. By mesa etching, some of the first conductivity type semiconductor layer 30 is exposed in an upward direction.

Thereafter, a first electrode 70 is formed on the first conductivity type semiconductor layer 30 and a second electrode 80 is formed on the second conductivity type semiconductor layer 50.

Referring to FIG. 7, the growth substrate 10 and the mask layer 12 are cut to divide the growth substrate 10 and the light emitting structure layer 60 into chip units. The growth substrate 10 may be cut by a scribing method or a breaking method, and the mask layer 12 may be removed by an etching method. At this time, the mask layer 12 may be completely or partially removed. In the case where the mask layer 12 is removed completely as shown in FIG. 7, the stepped portion 21 is formed at a lower edge region of the undoped nitride layer 20. Also, in the case where the mask layer 12 is formed as shown in FIG. 17, a protrusion pattern may be formed on a side surface of the undoped nitride layer where the stepped portion 21 is formed.

Figure 9:
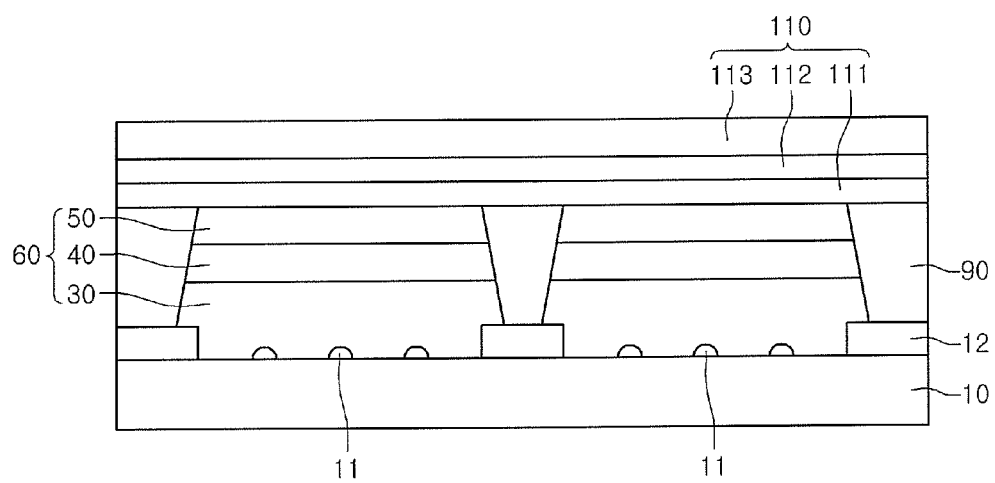
Figure 10:
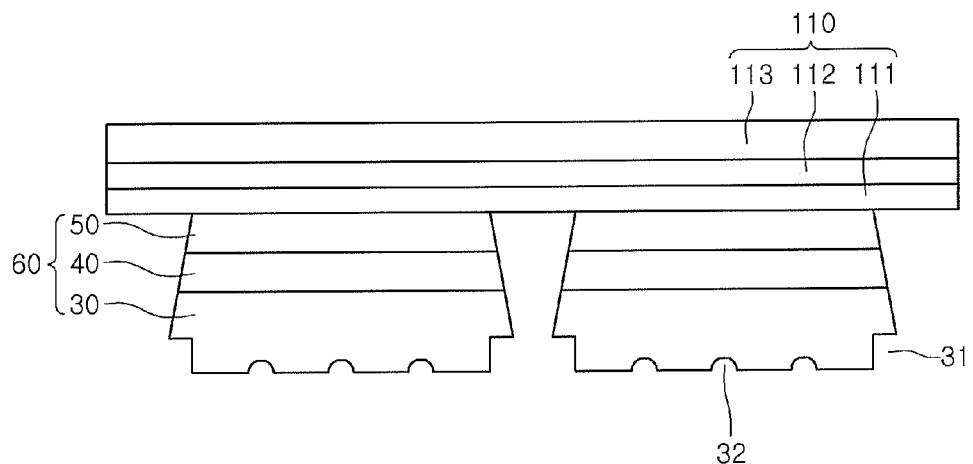
Figure 11:
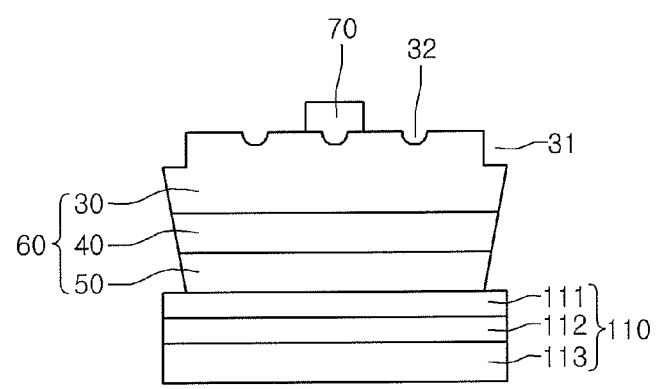

FIGS. 8 to 11 show a third embodiment of a light emitting device and various stages of its manufacture. Referring first to FIG. 11, the light emitting device includes a light emitting structure layer 60 formed from a first conductivity type semiconductor layer 30, an active layer 40, and a second conductivity type semiconductor layer 50. A first electrode 70 is formed on the first conductivity type semiconductor layer 30 and a second electrode 110 is formed under the second conductivity type semiconductor layer 50.

The second electrode 110 includes an ohmic contact layer 111 under the second conductivity type semiconductor layer 50, a reflective layer 112 under the ohmic contact layer 111, and a conductivity supporting substrate 113 under the reflective layer 112.

As indicated, the semiconductor layers on the second electrode 110 include a first semiconductor layer, a second semiconductor layer, and the active layer between the first semiconductor layer and the second semiconductor layer. In the current embodiment, the first semiconductor layer is implemented by the first conductivity type semiconductor layer 30, and the second semiconductor layer is implemented by the second conductivity type semiconductor layer 50.

The first conductivity type semiconductor layer 30 is formed with a stepped portion 31 at an upper side surface thereof and with upper grooves 32 at an upper surface thereof. The upper grooves 32 may act as photonic crystals which allow the light emitted from the active layer 40 to be effectively extracted to an outside.

The first conductivity type semiconductor layer 30 includes a first surface contacting the active layer 40 and a second surface oppositely facing the first surface. The area of the second surface may be smaller than a maximum area of the first conductivity type semiconductor layer due to the stepped portion 31.

Figure 8:
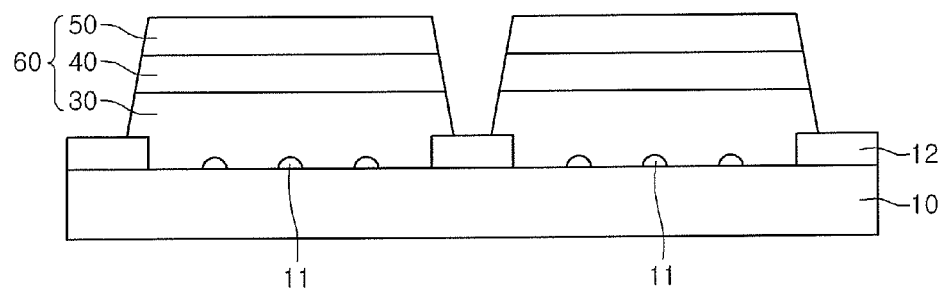
FIGS. 8 to 11 are sectional diagrams showing a third embodiment of a light emitting device and various stages of its manufacture.

One method for manufacturing the third embodiment of the light emitting device is shown with reference to FIGS. 8 to 11. Referring to FIG. 8, a growth substrate 10 is prepared and a plurality of protrusions 11 and a mask layer 12 are formed on the growth substrate 10. The growth substrate 10 may be formed, for example, from one or more of sapphire (Al2O3), SiC, Si, GaAs, ZnO, MgO, GaN, Glass or Ga2O3, and mask layer 12 may be formed of the same material as protrusions 11, e.g., one or more of SiO2, SiN, GaO, ZnO, or ITO.

A light emitting structure layer 60, including a first conductivity type semiconductor layer 30, an active layer 40, and a second conductivity type semiconductor layer 50, is grown on the growth substrate 10 on which the mask layer 12 and the protrusions 11 are formed. The first conductivity type semiconductor layer 30 is grown on the growth substrate 10 to cover the mask layer 12 and the protrusions 11 through a horizontal growth and a vertical growth.

The first conductivity type semiconductor layer 30 may be formed, for example, from a GaN-based semiconductor layer including an n-type impurity such as silicon (Si), and the second conductivity type semiconductor layer 50 may be formed, for example, from a GaN-based semiconductor layer including a p-type impurity such as Mg.

The active layer 40 may be formed of InGaN layer/GaN layer having a single quantum well structure or multi-quantum well structure by supplying ammonia (NH3), trimethylgallium (TMGa), and trimethylindium (TMIn).

Referring to FIG. 9 since the light emitting structure layer 60 is grown into multiple chip unit on the substrate at areas defined by mask layer 12, a spacing exists between the light emitting structure layers 60 that are adjacent to each other. Therefore, a protective layer 90 is formed between the light emitting structure layer 60 and light emitting structure layer 60. The protective layer 90 may be formed of a material such as polyimide or SOG or another material.

A second electrode 110 is formed on the light emitting structure layer 60 and the protective layer 90. The second electrode layer 110 may be formed by first forming an ohmic contact layer 111, forming a reflective layer 112 on the ohmic contact layer 111, and forming a conductivity supporting substrate 113 on the reflective layer 112.

The conductivity supporting substrate 113 may be formed to include, for example, at least one of copper (Cu), titanium (Ti), molybdenum (Mo), chromium (Cr), nickel (Ni), aluminum (Al), platinum (Pt), gold (Au), tungsten (W), or conductivity semiconductor material. The reflective layer 112 may be formed from a metal including, for example, at least one of silver (Ag), aluminum (Al), copper (Cu), or nickel (Ni) having a high reflectivity. Also, the ohmic contact layer 111 may be formed of a transparent conductivity oxide, such as indium tin oxide (ITO), aluminum-doped zinc oxide (AZO), indium zinc oxide (IZO), antimony tin oxide (ATO), or zinc indium tin oxide (ZITO).

Referring to FIG. 10, the growth substrate 10, mask layer 12, protective layer 90, and protrusions 11 are removed. The growth substrate 10 may be removed using, for example, a laser lift-off method or a chemical lift-off method. Since the mask layer 12 and the protrusions 11 are disposed between the growth substrate 10 and the light emitting structure layer 60, the growth substrate 10 can be easily separated from the light emitting structure layer 60. That is, because the mask layer 12 and the protrusions 11 are not strongly bonded to the light emitting structure layer 60, the more wide the area of the mask layer 12 and the protrusions 11, the easier the separation of the growth substrate 10.

As the growth substrate 10 is separated, the protrusions 11 and the mask layer 12 can be easily separated, and the protective layer 90 can be removed by using an etchant. As the protrusions 11 and the mask layer 12 are removed, upper grooves 32 and stepped portions 31 are formed in the first conductivity type semiconductor layer 30. Referring to FIG.

11, a first electrode 70 is formed on the first conductivity type semiconductor layer 30 and then the second electrode 110 is separated.

Figure 13:
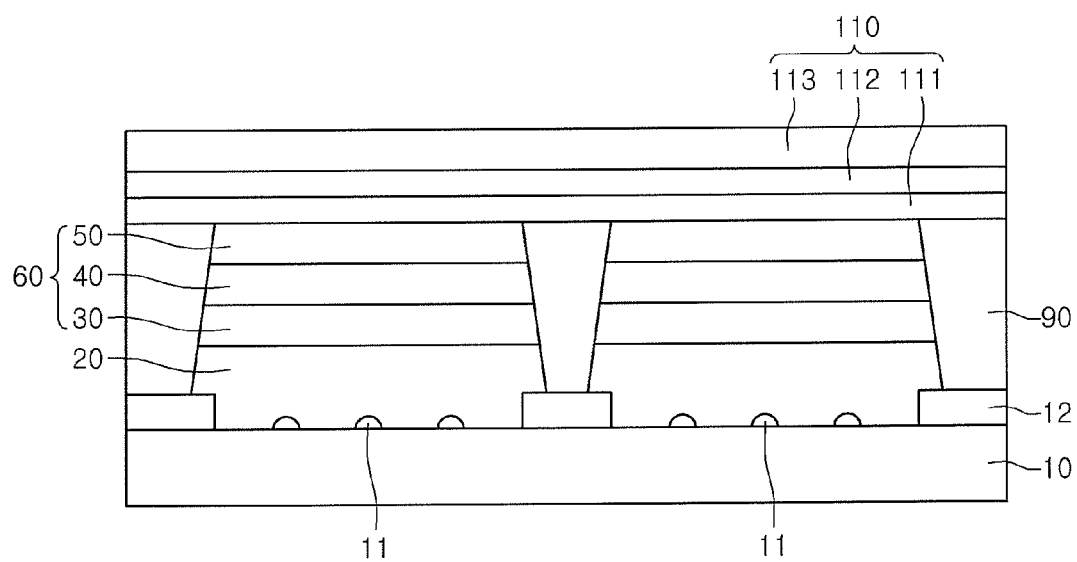
Figure 14:
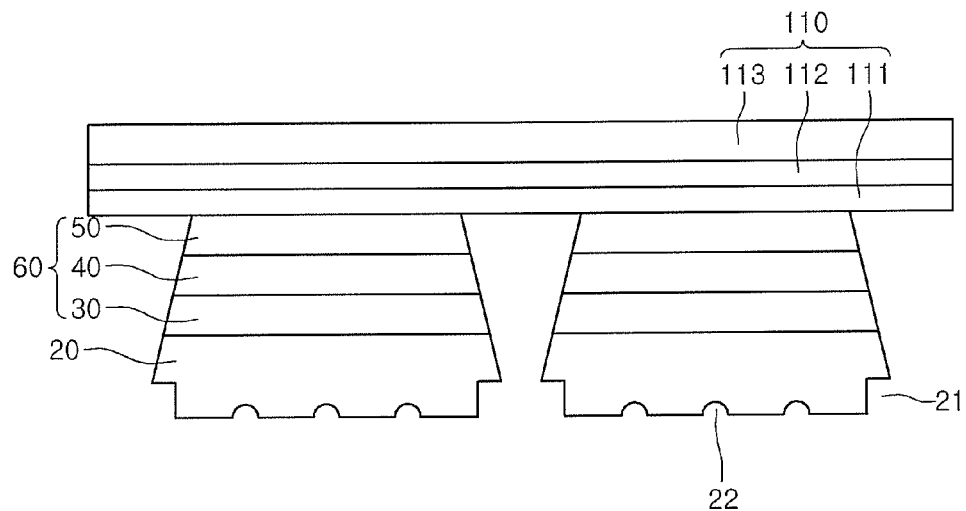
Figure 15:
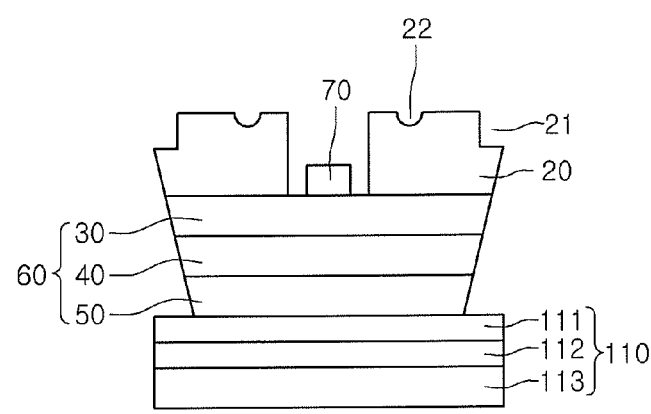

FIGS. 12 to 15 show a fourth embodiment of a light emitting device and various stages of its manufacture. Referring to FIG. 15, the light emitting device includes a light emitting structure layer 60 formed from a first conductivity type semiconductor layer 30, an active layer 40, and a second conductivity type semiconductor layer 50 is formed, and an undoped nitride layer 20 is formed on the first conductivity type semiconductor layer 30.

A first electrode 70 is formed on the first conductivity type semiconductor layer 30 exposed by selectively removing the undoped nitride layer 20, and a second electrode 80 is formed under the second conductivity type semiconductor layer 50.

As indicated, the semiconductor layers on the second electrode 110 include a first semiconductor layer, a second semiconductor layer, and the active layer between the first semiconductor layer and the second semiconductor layer. In the current embodiment, the first semiconductor layer is implemented by the undoped nitride layer 20 and the first conductivity type semiconductor layer 30, and the second semiconductor layer is implemented by the second conductivity type semiconductor layer 50.

The undoped nitride layer 20 is formed with a stepped portion 21 at an upper side surface thereof and with upper grooves 22 at an upper surface thereof. The upper grooves 22 may act as photonic crystals, which allow the light emitted from the active layer 40 to be effectively extracted to an outside. The undoped layer may be formed from a material other than an nitride, and the same is true of the undoped layer in the third and other embodiments described herein.

The undoped nitride layer 20 includes a first surface contacting the first conductivity type semiconductor layer 30 and a second surface oppositely facing the first surface. The area of the second surface may be smaller than a maximum area of the first conductivity type semiconductor layer due to the stepped portion 21.

Figure 12:
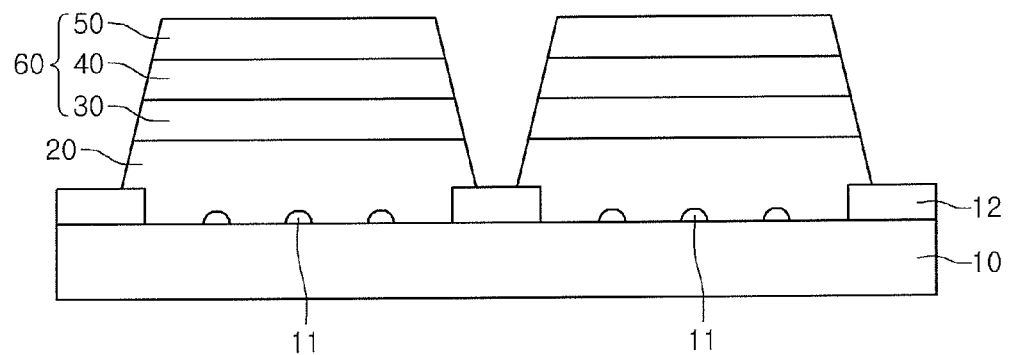
FIGS. 12 to 15 are sectional diagrams showing a fourth embodiment of a light emitting device and various stages of its manufacture.

One method for manufacturing the fourth embodiment of the light emitting device will now be described with reference to FIGS. 12 to 15. Referring to FIG. 12, a growth substrate 10 is prepared and a plurality of protrusions 11 and a mask layer 12 are formed on the growth substrate 10. The growth substrate 10 may be formed, for example, from one or more of sapphire (Al2O3), SiC, Si, GaAs, ZnO, MgO, GaN, Glass or Ga2O3. The mask layer 12 may be formed of the same material as that of the protrusions 11 and may be, for example, formed of one or more of SiO2, SiN, GaO, ZnO, or ITO.

The undoped nitride layer 20 is grown on the growth substrate 10 on which the mask layer 12 and the protrusions 11 are formed. A light emitting structure layer 60, including a first conductivity type semiconductor layer 30, an active layer 40, and a second conductivity type semiconductor layer 50, is grown on the undoped nitride layer 20. The undoped nitride layer 20 is grown on the growth substrate 10 to cover the mask layer 12 and the protrusions 11 through a horizontal growth and a vertical growth.

The first conductivity type semiconductor layer 30 may be formed, for example, from a GaN-based semiconductor layer including an n-type impurity such as silicon (Si), and the second conductivity type semiconductor layer 50 may be formed, for example, from a GaN-based semiconductor layer including a p-type impurity such as Mg.

The active layer 40 may be formed of InGaN layer/GaN layer having a single quantum well structure or multi-quantum well structure by supplying ammonia (NH3), trimethylgallium (TMGa), and trimethylindium (TMIn).

Referring to FIG. 13, because the light emitting structure layer 60 is grown into chip units defined by the mask layer 12, a spacing exists between the light emitting structure layers 60 adjacent to each other. Therefore, a protective layer 90 may be formed between the light emitting structure layer 60 and the light emitting structure layer 60. The protective layer 90 may be formed of a material such as polyimide or SOG or another material.

A second electrode 110 is formed on the light emitting structure layer 60 and the protective layer 90. The second electrode layer 110 may be formed by first forming an ohmic contact layer 111, forming a reflective layer 112 on the ohmic contact layer 111, and forming a conductivity supporting substrate 113 on the reflective layer 112.

The conductivity supporting substrate 113 may be formed to include at least one of copper (Cu), titanium (Ti), molybdenum (Mo), chromium (Cr), nickel (Ni), aluminum (Al), platinum (Pt), gold (Au), tungsten (W), or conductivity semiconductor material. The reflective layer 112 may be formed to include a metal corresponding to at least one of silver (Ag), aluminum (Al), copper (Cu), or nickel (Ni) having a high reflectivity. Also, the ohmic contact layer 111 may be formed of a transparent conductivity oxide, such as indium tin oxide (ITO), aluminum-doped zinc oxide (AZO), indium zinc oxide (IZO), antimony tin oxide (ATO), or zinc indium tin oxide (ZITO).

Referring to FIG. 14, the growth substrate 10, mask layer 12, protective layer 90, and protrusions 11 are removed. The growth substrate 10 may be removed using, for example, a laser lift-off method or a chemical lift-off method. Since the mask layer 12 and the protrusions 11 are disposed between the growth substrate 10 and the undoped nitride layer 20, the growth substrate 10 can be easily separated from the undoped nitride layer 20. That is, since the mask layer 12 and the protrusions 11 are not strongly bonded to the undoped nitride layer 20, the more wide the area of the mask layer 12 and the protrusions 11, the easier the separation of the growth substrate 10.

As the growth substrate 10 is separated, the protrusions 11 and the mask layer 12 can be easily separated and the protective layer 90 can be removed by using an etchant. Accordingly upper grooves 32 and stepped portions 31 are formed in the undoped nitride layer 20.

Referring to FIG. 15, the undoped nitride layer 20 is selectively removed to expose the first conductivity type semiconductor layer 30, and a first electrode 70 is formed on the first conductivity type semiconductor layer 30.

Figure 18:
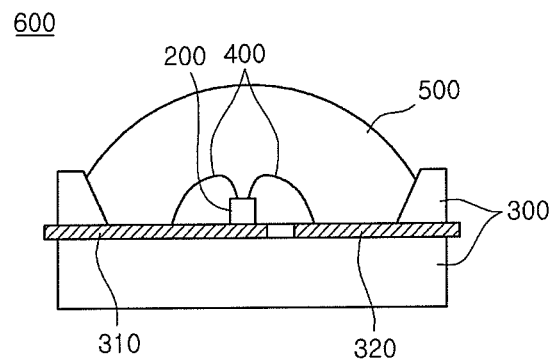
FIG. 18 is a diagram showing one embodiment of a light emitting device package that may include any of the aforementioned embodiments of the light emitting device.

FIG. 18 shows a light emitting device package that includes any of the aforementioned embodiments of the light emitting device. Referring to FIG. 18, the light emitting device package 600 includes a package body 300, first and second conductivity layers 310 and 320 mounted on the package body 300, a light emitting device 200 mounted on the package body 300 and electrically coupled to the first and second conductivity layers 310 and 320, and a molding member 500 enclosing the light emitting device 200.

The package body 300 may be formed to include, for example, one or more of a silicon material, a synthetic resin material, or a metallic material and may have an inclined surface around the light emitting device 200.

The first conductivity layer 310 and the second conductivity layer 320 are electrically separated and supply electric power to the light emitting device 200. Also, the first and second conductivity layers 310 and 320 may reflect light generated from the light emitting device 200 to increase light efficiency and may emit heat generated from the light emitting device 200 to an outside or external location.

The light emitting device 200 may be any of the light emitting devices previously described, and light emitting device 200 may be mounted on the package body 300 or on the first conductivity layer 310 or the second conductivity layer 320. The light emitting device 200 may be electrically coupled to the first conductivity layer 310 and the second conductivity layer 320 through a wire 400.

When the package of FIG. 18 is formed to include a light emitting device 200 according to the first or second embodiments, two wires 400 are used. When the package is formed to include a light emitting device 200 according to the third or fourth embodiments, only one wire 400 may be used. Alternatively, in the case where the light emitting device 200 is connected by a flip chip method, the wire 400 may not be used at all.

The molding member 500 may be provided to enclose and protect the light emitting device 100. A fluorescent material may be included in the molding member 500 to change the wavelength of light emitted from the light emitting device 200. Because the light emitting device package 600 employs a light emitting device 200 having enhanced light efficiency, it follows that light emitting device package 600 will also demonstrate superior light efficiency.

According to one embodiment, the light emitting device package 600 may include a plurality of light emitting device packages arrayed onto a substrate. A plurality of optical members, such as a light guide panel, a prism sheet, a diffusion sheet, a fluorescent sheet, and/or the like, may be arranged on a path of light emitted from the light emitting device package 600. The light emitting device package, substrate, and optical members may function as a backlight unit or lighting unit, and a lighting system may include, for example, a backlight unit, a lighting unit, an indicator unit, a lamp, a streetlamp, etc.

Figure 19:
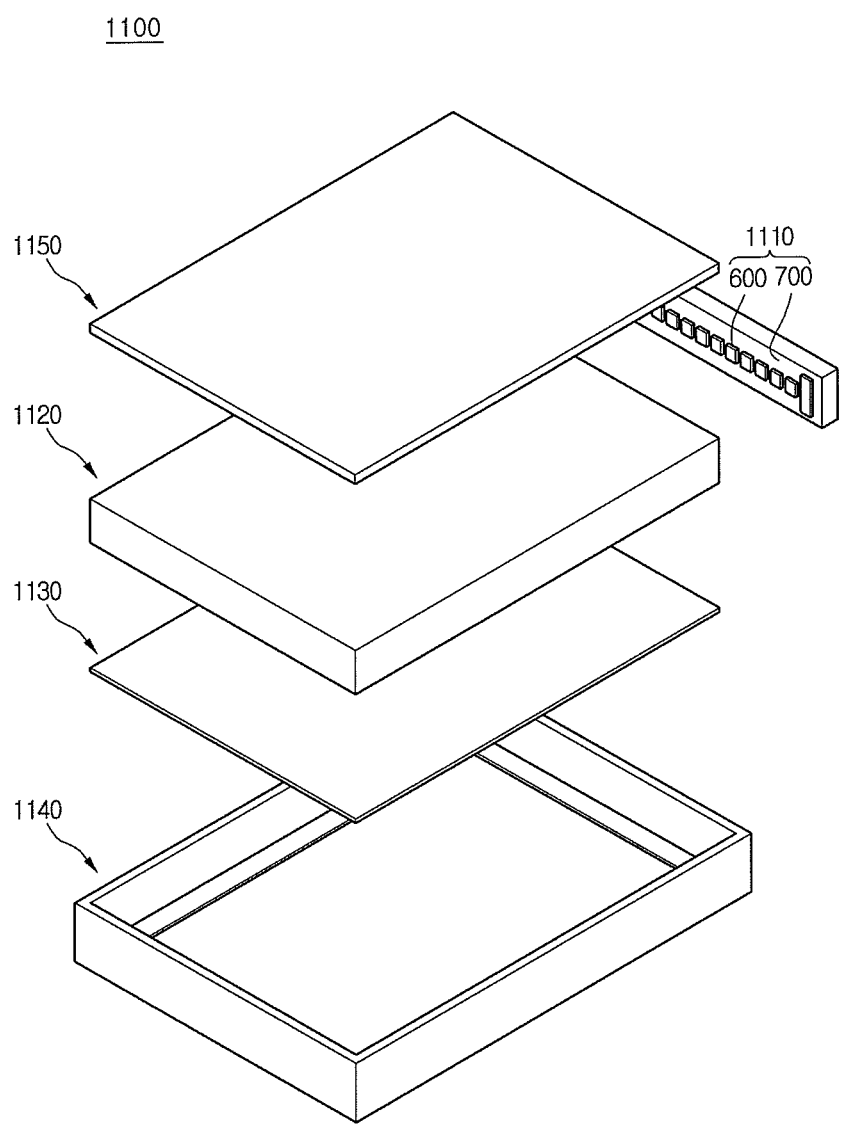
FIG. 19 is a diagram showing one embodiment of a backlight unit that may include any of the aforementioned embodiments of the light emitting device or package.

FIG. 19 shows a disassembled view of a backlight unit 1100 that includes a light emitting device or package according to any one of the aforementioned embodiment. The backlight unit 1100 may serve as a lighting system for a variety of applications.

The backlight unit 1100 may include a bottom frame 1140, a light guide member 1120 disposed in the bottom frame, and a light emitting module 1110 disposed on at least one side surface of light guide member 1120 and/or under light guide member 1120. A reflective sheet 1130 may be disposed under the light guide member 1120.

The bottom frame 1140 may be formed in a box shape a top surface of which is opened such that the light guide member 1120, the light emitting module 1110 and the reflective sheet 1130 can be received. The bottom frame 1140 may be formed of a metal or resin material, but other materials are also possible.

The light emitting module 1110 may include a substrate 700 and a plurality of light emitting device packages 600 mounted on the substrate 700. The plurality of light emitting device packages 600 may provide light to the light guide member 1120. In the light emitting module 1110 according to the current embodiment, it is illustratively shown that the light emitting device packages 600 are mounted on substrate 700, but in other embodiments the light emitting devices may be mounted directly on the substrate 700.

As shown in FIG. 19, the light emitting module 1110 may be disposed on at least one of inner side surfaces of the bottom frame 1140, and thus may provide light to at least one of the side surfaces of the light guide member 1120.

It is also to be understood that the light emitting module 1110 may be disposed under the light guide member 1120 inside the bottom frame 1140 to provide light toward a bottom surface of the light guide member 1120. However, the constitution may be modified according to the specific design requirements of the backlight unit 1100 according to, for example, an intended application.

The light guide member 1120 may be disposed inside the bottom frame 1140. The light guide member 1120 may convert the light provided from the light emitting module to a planar light source and guide the converted plane light source to a display panel (not shown).

The light guide member 1120 may be, for example, a light guide panel (LGP). The LGP may be formed of, for example, one of acryl-series resin such as polymethyl metaacrylate (PMMA), polyethylene terephthlate (PET), poly carbonate (PC), COC, and polyethylene naphthalate resin.

An optical sheet 1150 may be disposed on the light guide member 1120, and may include, for example, at least one of a diffusion sheet, a light-condensing sheet, a brightness enhancement sheet and a fluorescent sheet. According to one example, the optical sheet 1150 may be configured by the diffusion sheet, the light-condensing sheet, the brightness enhancement sheet and the fluorescent sheet stacked. In this case, the diffusion sheet 1150 diffuses the light emitted from the light emitting module 1110 uniformly, and the diffused light may be condensed on the display panel (not shown) by the light-condensing sheet.

At this time, the light emitted from the light-condensing sheet is a randomly polarized light, and the brightness enhancement sheet may increase the polarization of the light emitted from the light-condensing sheet. The light-condensing sheet may be, for example, a horizontal and/or vertical prism sheet. Also, the brightness enhancement sheet may be, for example, a dual brightness enhancement film. Also, the fluorescent sheet may be a transparent plate or film including a fluorescent material.

The reflective sheet 1130 may be disposed under the light guide member 1120, and may serve to reflect light emitted from the bottom surface of the light guide member 1120 toward a light emitting surface of the light guide member 1120. The reflective sheet 1130 may be formed, for example, of a resin material having good reflectivity such as PET, PC, or PVC resins or other materials.

Figure 20:
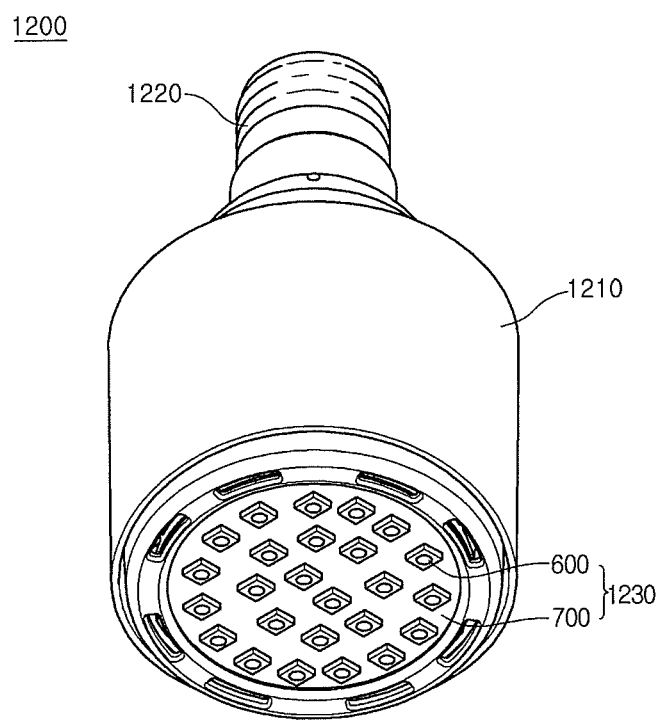
FIG. 20 is a diagram showing one embodiment of a lighting unit that may include any of the aforementioned embodiments of the light emitting device or package.

FIG. 20 shows a lighting unit 1200 that includes any one or more of the aforementioned embodiments of the light emitting device or light emitting device package. This lighting unit includes a case body 1210, a light emitting module 1230 installed in the case body 1210, and a connection terminal 1220 installed in the case body 1210 to be supplied with an electric power from an external power source.

The case body 1210 may be formed of a material having good heat shielding characteristic, for example, a metal material or a resin material.

The light emitting module 1230 may include a substrate 700, and at least one light emitting device package 600 mounted on the substrate 700. In the light emitting module 1230 according to the current embodiment, it is illustratively shown that the light emitting device packages 600 are mounted on the substrate 700, but the light emitting devices according to any of the embodiments described herein may be mounted directly on the substrate 700.

The substrate 700 may be an insulator substrate on which a circuit pattern is printed and may include, for example, a general printed circuit board (PCB), a metal core PCB, a flexible PCB, a ceramic PCB, etc. Also, the substrate 700 may be formed of a material to efficiently reflect light, and a surface thereof may be formed in a color capable of efficiently reflecting light, for example, white color, silver color, or the like.

At least one light emitting device package may be mounted on the substrate 700. Each of the light emitting device packages 200 may include at least one light emitting diode (LED). The light emitting diode may include a color LED emitting red, green, blue or white light, and a UV LED emitting ultraviolet (UV).

The light emitting module 1230 may have a combination of several LEDs so as to obtain desired color and luminance. For example, the light emitting module 1230 may have a combination of a white LED, a red LED, and a green LED so as to obtain a high color rendering index (CRI). A fluorescent sheet may be further disposed on a path of light emitted from the light emitting module 1230. The fluorescent sheet converts the wavelength of the light emitted from the light emitting module.

For example, when the light emitted from the light emitting module 1230 has a blue wavelength band, the fluorescent sheet may include a yellow fluorescent material, so that the light, which is emitted from the light emitting module 1230 and passes through the fluorescent sheet, finally appears as white light.

The connection terminal 1220 may be electrically coupled to the light emitting module 1230 to supply an electric power to the light emitting module 1230. As shown in FIG. 19, the connection terminal 1220 may be screwed and coupled to an external power, but the invention is not limited thereto. For example, the connection terminal 1220 may be made in a pin type and inserted into an external power, or may be connected to the external power through a power line.

As described above, the lighting system may include at least one of a light guide member, a diffusion sheet, a light-condensing sheet, a brightness enhancement sheet and a fluorescent sheet on a traveling path of light to obtain a desired optical effect. Because the lighting system includes a light emitting device or package having superior light efficiency, the lighting system can show superior light efficiency as well.

One or more embodiments described herein, thus, provide a light emitting device having a novel structure and a method of manufacturing the same. One or more of these embodiments also provide a light emitting device with enhanced light efficiency, and a method of manufacturing the same. One or more of these embodiments, also provide a light emitting device and a method of manufacturing the same in which a growth substrate can be easily separated.

In one embodiment, a light emitting device comprises: a first semiconductor layer; a second semiconductor layer; and an active layer between the first and second semiconductor layers, the first semiconductor layer includes a first surface facing the active layer, and a second surface oppositely facing the first surface, and the first semiconductor layer has a stepped portion formed at a side surface thereof and thus the area of the second surface is smaller than a maximum area of the first semiconductor layer.

In another embodiment, a light emitting device package comprises: a package body; a first conductivity layer and a second conductivity layer on the package body; a light emitting device disposed on the package body and electrically connected to the first conductivity layer and the second conductivity layer; and a molding member enclosing the light emitting device, wherein the light emitting device includes a first semiconductor layer, a second semiconductor layer, and an active layer between the first semiconductor layer and the second semiconductor layer, the first semiconductor layer includes a first surface facing the active layer, and a second surface oppositely facing the first surface, and the first semiconductor layer has a stepped portion formed at a side surface thereof and thus the area of the second surface is smaller than a maximum area of the first semiconductor layer.

In a further embodiment, a lighting system comprises: a light emitting module including a substrate; and a light emitting device on the substrate, wherein the light emitting device comprises: a first semiconductor layer; a second semiconductor layer; and an active layer between the first semiconductor layer and the second semiconductor layer, the first semiconductor layer includes a first surface facing the active layer, and a second surface oppositely facing the first surface, and the first semiconductor layer has a stepped portion formed at a side surface thereof and thus the area of the second surface is smaller than a maximum area of the first semiconductor layer.

In still another embodiment, a method of manufacturing a light emitting device, comprises: forming a mask layer defining a plurality of light emitting structure layer growth regions on a growth substrate; forming a light emitting structure layer including a first conductivity type semiconductor layer, an active layer and a second conductivity type semiconductor layer from the light emitting structure layer growth regions; selectively removing the light emitting structure layer and forming a first electrode on the first conductivity type semiconductor layer and a second electrode on the second conductivity type semiconductor layer; and cutting the growth substrate and the mask layer to separate the growth substrate and the light emitting structure layer.

In yet another embodiment, a method of manufacturing a light emitting device, comprises: forming a mask layer defining a plurality of light emitting structure layer growth regions on a growth substrate; forming a light emitting structure layer including a first conductivity type semiconductor layer, an active layer and a second conductivity type semiconductor layer from the light emitting structure layer growth regions; forming a protective layer between the light emitting structure layers; forming a second electrode on the light emitting structure layer and the protective layer; separating the growth substrate and removing the mask layer and the protective layer; forming a first electrode on the first conductivity type semiconductor layer; and cutting the second electrode to separate the second electrode and the light emitting structure layer.

In accordance with another embodiment, a light emitting device comprises a first semiconductor layer; a second semiconductor layer; and an active layer between the first and second semiconductor layers, wherein the first semiconductor layer includes a first surface facing the active layer, a second surface opposing the first surface, and a side surface that includes a stepped portion. The stepped portion causes the side surface to extend beyond one of the first surface or second surface.

The area of the first surface may be greater than an area of the second surface, the area of the second surface may be less than the area of the first surface as a result of the stepped portion, or an area of the first surface may be less than an area of the second surface. In addition, the first semiconductor layer is a first conductivity type and the second semiconductor layer is a second conductivity type.

The device may also include a buffer layer, wherein a first semiconductor layer is located between the buffer layer and active layer, the first semiconductor layer is of a first conductivity type, and the second semiconductor layer is of a second conductivity type. The buffer layer may be on a first portion of the first conductivity type semiconductor, and the device may further comprise a first electrode on the first semiconductor layer where the buffer layer is not formed and a second electrode under the second semiconductor layer.

The buffer layer may be divided into first and second sections disposed on the first semiconductor layer, the first and second sections of the buffer layer separated to expose a portion of the first semiconductor layer, the first electrode electrically coupled to the exposed portion of the first semiconductor layer. The buffer layer may be an undoped layer or a doped layer, and if undoped may include a nitride.

The device may further include at least one reflector to reflect light emitted from the active layer. The reflector is located adjacent the first semiconductor layer, and may be formed as a protrusion that extends from a surface of a substrate that supports or is coupled to the first semiconductor layer.

The device may also include at least one diffuser, located on the second surface of the first semiconductor layer, to diffuse light emitted from the active layer. The diffuser may extend into the second surface of the first semiconductor layer, and may include a recess that extends into the second surface of the first semiconductor layer.

In accordance with another embodiment, a light emitting device comprises a buffer layer, a first semiconductor layer, a second semiconductor layer, and an active layer between the first and second semiconductor layers. The first semiconductor layer is between the buffer layer and active layer, the active layer is between the first and second semiconductor layers, and a bottom surface of the buffer layer has an area smaller than an area of at least one of the surfaces of the first semiconductor layer.

Additionally, a side surface of the buffer layer may includes a stepped portion which causes a top surface of the buffer layer facing the first semiconductor layer to have an area greater than the bottom surface of the buffer layer.

Additionally, a side surface of the buffer layer may includes a stepped portion which causes the side surface of the buffer layer to extend beyond at least one of a top surface or the bottom surface of the buffer layer. The buffer layer may be a doped layer or an undoped layer.

In addition, the device may include at least one reflector to reflect light emitted from the active layer. The reflector may be adjacent the buffer layer and may include a protrusion that extends from a surface of a substrate that supports or is coupled to the buffer layer.

A light emitting device package may be formed to comprise a light emitting device in accordance with any one of the aforementioned embodiments.

In accordance with another embodiment, a lighting system comprises a light emitting device as recited in claim 1, wherein said device is coupled to a substrate of a light emitting module.

In accordance with another embodiment, a method of manufacturing a light emitting device comprises forming a mask layer on a substrate to define a region of a light emitting device; forming a semiconductor layer of a first conductivity type, an active layer, and a semiconductor layer of a second conductivity type at said region; selectively removing the mask layer; and forming first and second electrodes electrically coupled to the first and second semiconductor layers respectively, wherein one of the semiconductor layers is formed to include a first surface facing the active layer, a second surface opposing the first surface, and a side surface that includes a stepped portion, and wherein the stepped portion causes the side surface to extend beyond one of the first surface or second surface.

In accordance with another embodiment, a method of manufacturing a light emitting device, comprises forming a mask layer on a substrate to define a region of a light emitting device; forming a semiconductor layer of a first conductivity type, an active layer, and a semiconductor layer of a second conductivity type at said region; selectively removing the mask layer; and forming first and second electrodes electrically coupled to the first and second semiconductor layers respectively, wherein one of the semiconductor layers is formed to include a first surface facing the active layer.

The method further includes forming a buffer layer coupled to the first and second semiconductor layers and the active layer, wherein a bottom surface of the buffer layer has an area smaller than an area of at least one of the surfaces of the semiconductor layer of the first conductivity type or the second conductivity type. Also, buffer layer may include a stepped portion that causes the bottom surface of the buffer layer to have an area smaller than an area of at least one of the surfaces of the semiconductor layer of the first conductivity type or the second conductivity type.

Herein, when a layer (or film) is referred to as being "on" another layer or substrate, it understood that it can be directly on the other layer or substrate, or that intervening layers may be present between them. Further, it will be understood that when a layer is referred to as being "under" another layer, it can be directly under the other layer, and or that one or more intervening layers may be present. In addition, it is to be understood that when a layer is referred to as being "between" two layers, that layer may be the only one between the two layers or one or more intervening layers may also be present between them.

In the figures, the dimensions of layers and regions are exaggerated for clarity of illustration. In addition, the dimension of each part does not reflect an actual size.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a metal layer;
a light emitting structure on the metal layer, including a first semiconductor layer, a second semiconductor layer between the first semiconductor layer and the metal layer, and an active layer between the first semiconductor layer and the second semiconductor layer;
a reflective layer between the metal layer and the light emitting structure;
a contact layer between the reflective layer and the light emitting structure; and
a first electrode on the first semiconductor layer of the light emitting structure,
wherein the first semiconductor layer of the light emitting structure has a stepped structure at an edge region of an upper portion of the first semiconductor layer,
wherein a lower portion of the first semiconductor layer has an outer lateral surface inclined with respect to a bottom surface of the first semiconductor layer,
wherein an interior angle between the outer lateral surface and the bottom surface of the first semiconductor layer is an obtuse angle,
wherein the first semiconductor layer is an n-type semiconductor layer and the second semiconductor layer is a p-type semiconductor layer,
wherein the stepped structure includes a lateral surface extended downward from a top surface of the first semiconductor layer and a bottom surface extended outward from the lateral surface of the stepped structure,
wherein the outer lateral surface of the lower portion of the first semiconductor layer is inclined from the bottom surface of the stepped structure with respect to the bottom surface of the first semiconductor layer,
wherein the first semiconductor layer includes a plurality of recesses,
wherein each of the plurality of recesses has a depth smaller than a vertical height of the stepped structure,
wherein the vertical height of the stepped structure is a distance between the top surface of the first semiconductor layer and the bottom surface of the stepped structure,
wherein a length of the top surface of the first semiconductor layer has a length smaller than a length of the bottom surface of the first semiconductor layer,
wherein the active layer and the second semiconductor layer have an outer lateral surface inclined with respect to a bottom surface of the second semiconductor layer, and
wherein an interior angle between the outer lateral surface of the second semiconductor layer and the bottom surface of the second semiconductor layer is an obtuse angle.

2. The device of claim 1, wherein the metal layer include at least one of copper (Cu), titanium (Ti), molybdenum (Mo), chromium (Cr), nickel (Ni), aluminum (Al), platinum (Pt), gold (Au), or tungsten (W).

3. The device of claim 1, wherein a length of the reflective layer is longer than a length of the bottom surface of the second semiconductor layer in one direction.

4. The device of claim 1, wherein a length of a bottom surface of the active layer is longer than a length of a bottom surface of the second semiconductor layer, and the length of the bottom surface of the active layer is smaller than a length of the bottom surface of the first semiconductor layer in one direction.

5. The device of claim 1, wherein the stepped structure includes a lateral surface adjacent to a top surface of the first semiconductor layer and a bottom surface adjacent to the outer lateral surface of the lower portion of the first semiconductor layer.

6. The device of claim 1, wherein an outer lateral surface of the light emitting structure is inclined with respect to a bottom surface of the second semiconductor layer.

7. The device of claim 6, wherein the outer lateral surface of the light emitting structure is inclined from the bottom surface of the stepped structure to the bottom surface of the second semiconductor layer.

8. The device of claim 1, wherein the outer lateral surface of the first semiconductor layer is located at an outer position than a position of the lateral surface of the stepped structure, and
wherein the bottom surface of the stepped structure is formed in a horizontal plane.

9. A light emitting device, comprising:
a metal layer;
a light emitting structure on the metal layer, including a first semiconductor layer, a second semiconductor layer between the first semiconductor layer and the metal layer, and an active layer between the first semiconductor layer and the second semiconductor layer;
a reflective layer between the metal layer and the light emitting structure;
a plurality of recesses on a top surface of the first semiconductor layer of the light emitting structure; and
a first electrode on at least one of the recesses,
wherein the first semiconductor layer of the light emitting structure has a stepped structure at an edge region of an upper portion of the first semiconductor layer,
wherein a lower portion of the first semiconductor layer has an outer lateral surface inclined with respect to a bottom surface of the first semiconductor layer,
wherein an interior angle between the outer lateral surface and the bottom surface of the first semiconductor layer is an obtuse angle, and
wherein the first electrode has a protrusion in the at least one of the recesses,
wherein the first semiconductor layer is an n-type semiconductor layer and the second semiconductor layer is a p-type semiconductor layer,
wherein the stepped structure includes a lateral surface extended downward from a top surface of the first semiconductor layer and a bottom surface extended outward from the lateral surface of the stepped structure,
wherein the outer lateral surface of the lower portion of the first semiconductor layer is inclined from the bottom surface of the stepped structure,
wherein each of the plurality of recesses has a depth smaller than a vertical height of the stepped structure,
wherein the vertical height of the stepped structure is a distance between the top surface of the first semiconductor layer and the bottom surface of the stepped structure,
wherein a length of the top surface of the first semiconductor layer has a length smaller than a length of the bottom surface of the first semiconductor layer,
wherein the active layer and the second semiconductor layer have an outer lateral surface inclined with respect to a bottom surface of the second semiconductor layer, and wherein an interior angle between the outer lateral surface of the second semiconductor layer and the bottom surface of the second semiconductor layer is an obtuse angle.

10. The device of claim 9, wherein a length of the metal layer is longer than the length of a bottom surface of the second semiconductor layer in one direction.

11. The device of claim 9, wherein the metal layer include at least one of copper (Cu), titanium (Ti), molybdenum (Mo), chromium (Cr), nickel (Ni), aluminum (Al), platinum (Pt), gold (Au), or tungsten (W).

12. The device of claim 9, wherein a length of the reflective layer is longer than a length of a bottom surface of the second semiconductor layer in one direction.

13. The device of claim 9, wherein a length of a bottom surface of the active layer is longer than a length of a bottom surface of the second semiconductor layer, and the length of the bottom surface of the active layer is smaller than a length of the bottom surface of the first semiconductor layer in one direction.

14. The device of claim 9, wherein an entire region of an outer lateral surface of the light emitting structure is inclined with respect to the bottom surface of the second semiconductor layer.

15. The device of claim 14, wherein an outer lateral surface of the light emitting structure is inclined from the bottom surface of the stepped structure to the bottom surface of the second semiconductor layer, and
wherein the bottom surface of the stepped structure is formed in a horizontal plane.

16. A light emitting device, comprising:
a metal layer;
a light emitting structure on the metal layer, including a first semiconductor layer, a second semiconductor layer between the first semiconductor layer and the metal layer, and an active layer between the first semiconductor layer and the second semiconductor layer;
a reflective layer between the metal layer and the light emitting structure;
a plurality of recesses on a top surface of the first semiconductor layer of the light emitting structure; and
a first electrode on at least one of the recesses,
wherein the first semiconductor layer of the light emitting structure has a stepped structure at an edge region of an upper portion of the first semiconductor layer,
wherein an outside of the metal layer is disposed to be outer than an outside of a bottom surface of the second semiconductor layer,
wherein a lower portion of the first semiconductor layer has an outer lateral surface inclined with respect to a bottom surface of the first semiconductor layer,
wherein an interior angle between the outer lateral surface and the bottom surface of the first semiconductor layer is an obtuse angle,
wherein the first electrode has a protrusion in the at least one of the recesses, and
wherein the first semiconductor layer is an n-type semiconductor layer, and the second semiconductor layer is a p-type semiconductor layer,
wherein the stepped structure includes a lateral surface extended downward from a top surface of the first semiconductor layer and a bottom surface extended outward from the lateral surface of the stepped structure,
wherein the outer lateral surface of the lower portion of the first semiconductor layer is inclined from the bottom surface of the stepped structure,
wherein each of the plurality of recesses has a depth smaller than a vertical height of the stepped structure,
wherein the vertical height of the stepped structure is a distance between the top surface of the first semiconductor layer and the bottom surface of the stepped structure,
wherein a length of the top surface of the first semiconductor layer has a length smaller than a length of the bottom surface of the first semiconductor layer, and
wherein a length of a bottom surface of the active layer is longer than a length of a bottom surface of the second semiconductor layer, and the length of the bottom surface of the active layer is smaller than the length of the bottom surface of the first semiconductor layer in one direction.

17. The device of claim 16, wherein the outer lateral surface of the first semiconductor layer is located at an outer position than a position of the lateral surface of the stepped structure.

18. The device of claim 16, wherein the metal layer include at least one of copper (Cu), titanium (Ti), molybdenum (Mo), chromium (Cr), nickel (Ni), aluminum (Al), platinum (Pt), gold (Au), or tungsten (W), and
wherein a length of the metal layer is longer than a length of the bottom surface of the second semiconductor layer in one direction.

19. The device of claim 16, wherein a length of the reflective layer is longer than a length of the bottom surface of the second semiconductor layer in one direction, and
wherein the first semiconductor layer is formed of a nitride-based layer.

* * * * *